(12) United States Patent
Iizuka (10) Patent No.: US 8,270,535 B2
(45) Date of Patent: Sep. 18, 2012

(54) ELECTRONIC DEVICE

(75) Inventor: Kunihiko Iizuka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 436 days.

(21) Appl. No.: 12/622,081

(22) Filed: Nov. 19, 2009

(65) Prior Publication Data
US 2010/0177850 A1 Jul. 15, 2010

(30) Foreign Application Priority Data

Jan. 15, 2009 (JP) ................................ 2009-006999

(51) Int. Cl.
*H03K 9/00* (2006.01)
(52) U.S. Cl. ...................................................... 375/316
(58) Field of Classification Search .................. 375/316
See application file for complete search history.

(56) References Cited

U.S. PATENT DOCUMENTS

| 5,850,598 A * | 12/1998 | Behrent ........................ 455/324 |
| 6,192,225 B1 * | 2/2001 | Arpaia et al. .............. 455/196.1 |
| 6,909,882 B2 * | 6/2005 | Hayashi et al. .................. 455/84 |
| 2001/0040932 A1 | 11/2001 | Lindquist et al. |
| 2003/0197638 A1 | 10/2003 | Bloebaum et al. |
| 2004/0102165 A1 | 5/2004 | Bloebaum et al. |
| 2006/0048021 A1 * | 3/2006 | Miyamoto ..................... 714/701 |
| 2008/0139194 A1 | 6/2008 | Bloebaum et al. |

FOREIGN PATENT DOCUMENTS

| JP | 11-143572 A | 5/1999 |
| JP | 2002-118479 A | 4/2002 |
| JP | 2002-218573 A | 8/2002 |
| JP | 2003-513503 T | 4/2003 |
| JP | 2005-524256 | 8/2005 |
| JP | 2006-174218 A | 6/2006 |
| JP | 2007-318446 A | 12/2007 |

* cited by examiner

Primary Examiner — Juan A Torres
(74) Attorney, Agent, or Firm — Birch, Stewart, Kolasch & Birch, LLP

(57) ABSTRACT

An electronic device satisfies: $f_{LO}=N \times f_{clk}$ ... (1); and $(N-1) \times f_{clk} < fD1 < N \times f_{clk} < fD2 < (N+1) \times f_{clk}$ ... (2), where: $f_{LO}$ represents a frequency of the local oscillator signal; N represents an integer; fD1 represents a lower limit frequency of the received signal; and fD2 represents an upper limit frequency of the received signal. Even if harmonic components, whose respective frequencies are respective integral multiples of the clock frequency $f_{clk}$, are mixed as spurious components into a path for a target signal, the harmonic spurious components do not fall within the target wave spectrum observed after the frequency conversion by the mixer. Thus, it is possible to prevent deterioration in reception performance, the deterioration being caused by in-band spurious components arising from higher harmonic waves whose frequencies are respective integral multiples of a clock frequency $f_{clk}$.

14 Claims, 6 Drawing Sheets

ELECTRONIC DEVICE

This Nonprovisional application claims priority under 35 U.S.C. §119(a) on Patent Application No. 2009-006999 filed in Japan on Jan. 15, 2009, the entire contents of which are hereby incorporated by reference.

TECHNICAL FIELD

The present invention relates to an electronic device for use in, e.g., wireless telecommunications, and particularly to an electronic device, including a frequency converter circuit and a circuit which operates in synchronization with a clock signal, which can remove spurious components caused by the clock signal or reduce an adverse affect of the spurious components.

BACKGROUND ART

In recent years, electronic apparatuses, particularly wireless and cable telecommunications apparatuses, generally include circuits, such as a digital circuit and a switched capacitor circuit, each of which operates in synchronization with a clock signal. In such circuits, an instantaneous current flows in synchronization with a clock signal. This causes noises each having a high level and each having a frequency of the clock signal (a fundamental wave) or a frequency of one of higher harmonics. The noises are mixed into a signal, thereby causing a deterioration in signal-to-noise (S/N) ratio of the signal. This phenomenon often leads to a problem, particularly in communications receivers.

Figure 8:
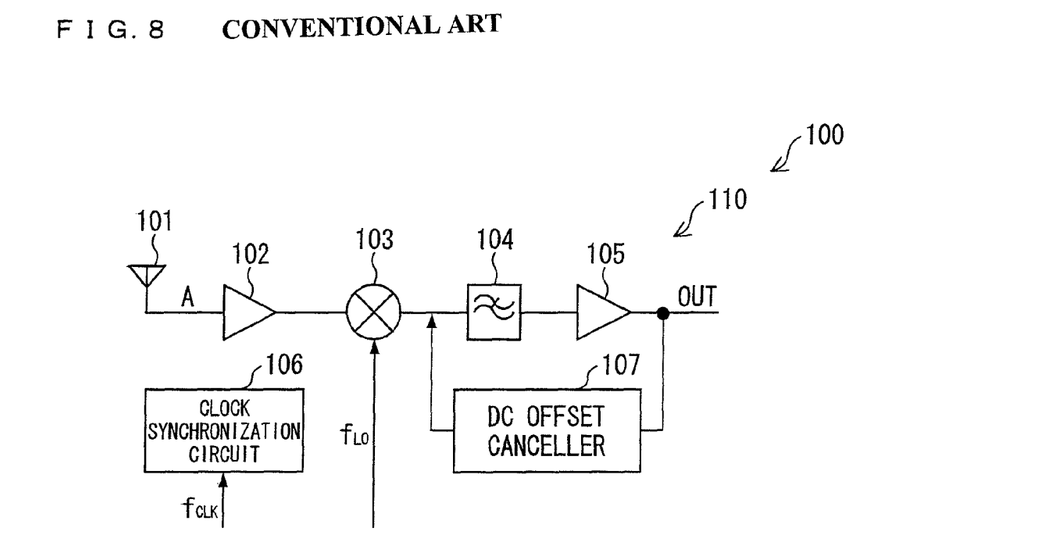
FIG. 8 is a block diagram illustrating a conventional electronic device including a direct conversion receiver and a clock synchronization circuit.

FIG. 8 is a block diagram illustrating an example of a conventional electronic device 100 including a direct conversion receiver 110 and a clock synchronization circuit 106. A RF signal received via an antenna 101 is amplified by an amplifier 102. Next, a mixer 103 carries out a frequency conversion by mixing the radio frequency (RF) signal thus amplified and a local oscillator signal having a frequency $f_{LO}$ so that the RF signal thus subjected to the frequency conversion is converted into a baseband signal. The baseband signal supplied from the mixer 103 is attenuated by a low-pass filter 104 so that its frequency components, other than a frequency component falling within a target signal band, are attenuated. The baseband signal thus attenuated is amplified by an amplifier 105, and is then outputted via an output terminal OUT.

The output signal of the amplifier 105 contains a direct-current (DC) offset. The DC offset is fed back by a DC offset canceller 107 to the output of the mixer, and is thus removed. The clock synchronization circuit 106 is used either to carry out part of a function of the direct conversion receiver or to carry out another function different from the function of the direct conversion receiver. In either case, the operations are carried out in synchronization with a clock signal having a clock frequency $f_{clk}$. This causes the higher harmonic waves, whose respective frequencies are respective integral multiples of the clock frequency $f_{clk}$, to be undesirably mixed into a path for the RF signal received via the antenna 101. The higher harmonic waves are mixed into the path via, e.g., power supply wiring, a common substrate, coupling of electric fields or magnetic fields, or an electromagnetic wave.

Figure 9:
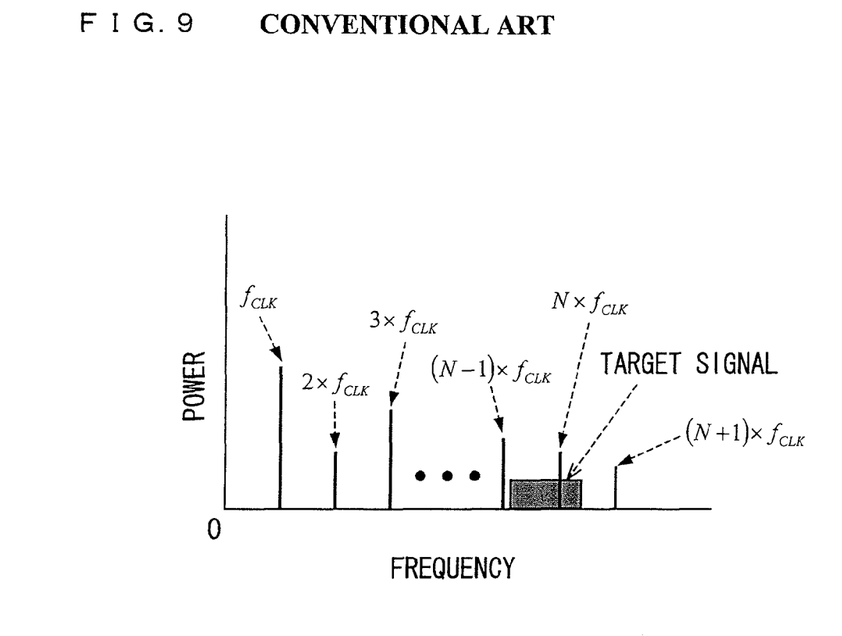
FIG. 9 illustrates a signal spectrum observed at a RF signal input point in each of the receivers shown in FIGS. 8 and 11, respectively.

FIG. 9 shows an, example of a signal spectrum at a RF signal input point A in the receiver of FIG. 8. FIG. 9 specifically shows: a target signal which has been subjected to a modulation and occupies a predetermined frequency band; the clock signal, having the clock frequency $f_{clk}$, which is undesirably mixed into at the RF signal input point A; and higher harmonic waves of the clock signal having the clock frequency $f_{clk}$.

Figure 10:
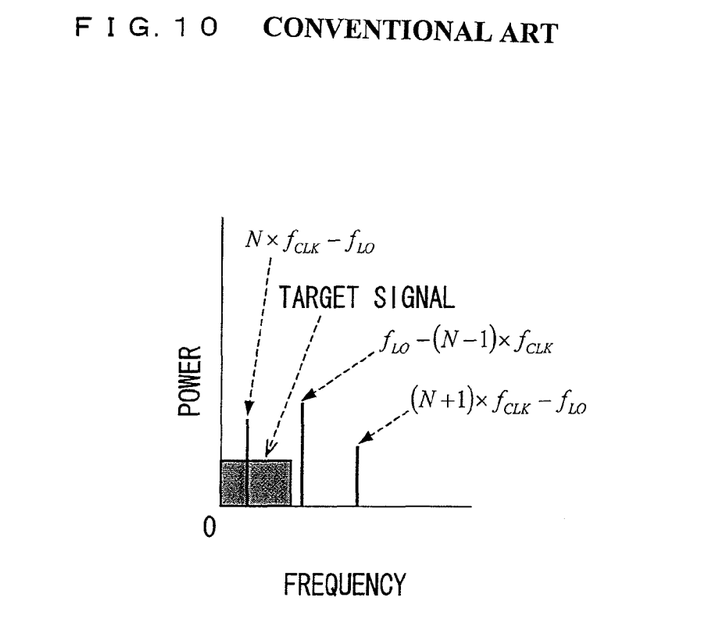
FIG. 10 illustrates a signal spectrum showing that a signal having the frequency band of FIG. 9 has been subjected to frequency conversion in the electronic device of FIG. 8 so as to be changed into a baseband signal.

These signals and the local oscillator signal having the frequency $f_{LO}$ are mixed by the mixer 103 of FIG. 8, so as to be converted into a baseband signal having a signal spectrum shown in FIG. 10.

It is assumed in FIG. 10 that $(N-1) \times f_{clk} < f_{LO} < N \times f_{clk}$ is satisfied. FIG. 10 shows that an in-band spurious component is generated at a frequency $N \times f_{clk} - f_{LO}$ by mixing an N-th higher harmonic wave having a frequency $N \times f_{clk}$ and the local oscillator signal having the frequency $f_{LO}$.

Figure 11:
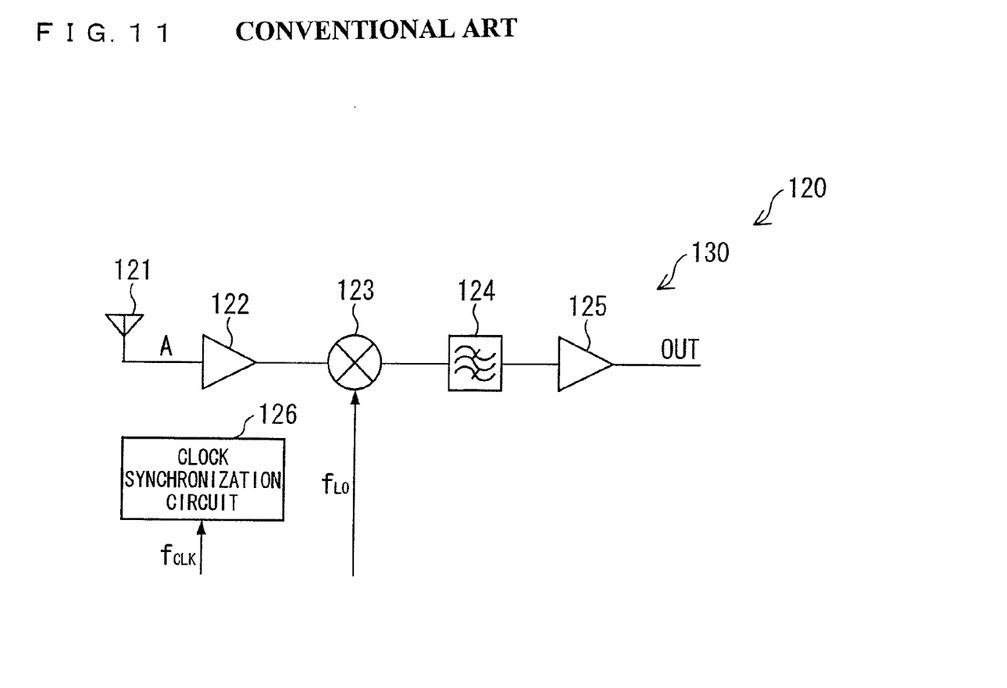
FIG. 11 is a block diagram illustrating a conventional electronic device including a heterodyne receiver and a clock synchronization circuit.

FIG. 11 is a block diagram illustrating an example of a conventional electronic device 120 including a heterodyne receiver 130 and a clock synchronization circuit 126. A signal spectrum of (i) a target signal at a RF signal input point A in the receiver 130 of FIG. 11 and (ii) higher harmonic waves of a clock signal having a clock frequency $f_{clk}$, which are mixed into at the RF signal input point A, is identical to that shown in FIG. 9.

According to the electronic device 130, a RF signal received via an antenna 121 is amplified by an amplifier 122. Next, a mixer 123 carries out a frequency conversion by mixing the RF signal thus amplified and a local oscillator signal having a frequency $f_{LO}$ so as to be converted into an intermediate frequency signal. After that, the intermediate frequency signal supplied from the mixer 123 is attenuated by a band-pass filter 124 so that its frequency components, other than a component falling within a target signal band, are attenuated. The intermediate frequency signal thus attenuated is amplified by an amplifier 125, and is thus outputted via an output terminal OUT.

The clock synchronization circuit 126 is used either to carry out part of a function of the superheterodyne receiver 130 or to carry out another function different from the function of the superheterodyne receiver 130. In either case, the operations are carried out in synchronization with a clock signal having a clock frequency $f_{clk}$. This causes the higher harmonic waves, whose respective frequencies are integral multiples of the clock frequency $f_{clk}$, to be undesirably mixed into a path for the RF signal received via the antenna 121. The higher harmonic waves are mixed into the path via, e.g., power supply wiring, a common substrate, coupling of electric fields or magnetic fields, or an electromagnetic wave.

Figure 12:
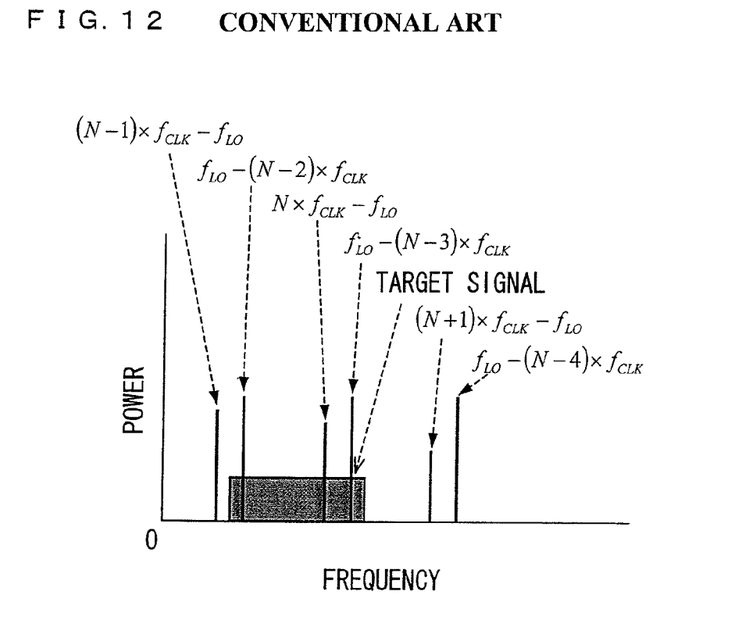
FIG. 12 illustrates a signal spectrum showing that a signal having the frequency band of FIG. 9 has been subjected to frequency conversion in the electronic device of FIG. 11 so as to be changed into a baseband signal.

These signals and the local oscillator signal having the frequency $f_{LO}$ are mixed by the mixer 123 of FIG. 11, so as to be converted into a baseband signal having a signal spectrum shown in FIG. 12.

It is assumed in FIG. 12 that $(N-2) \times f_{clk} < f_{LO} < (N-1) \times f_{clk}$ is satisfied. FIG. 12 shows that an in-band spurious component is generated at a frequency $N \times f_{clk} - f_{LO}$ by mixing an N-th higher harmonic wave having a frequency $N \times f_{clk}$ and the local oscillator signal having the frequency $f_{LO}$.

In order to address the problems, a method is known in which spurious components are removed by providing a notch filter having notch frequencies identical to respective frequencies of higher harmonic wave spurious components.

Patent Literature 1 discloses a method for removing spurious components in an orthogonal frequency division multiplexing (OFDM) receiver. According to the description as to the method, (i) a received signal, which has been subjected to a frequency conversion by a frequency converter circuit, is converted by a fast Fourier transform (FFT) circuit into a frequency-domain signal so that frequencies of respective spurious components which are mixed into the received signal are detected, (ii) notch frequencies of a variable notch filter are controlled so as to match the respective frequencies of the spurious components, thereby allowing a removal of the interfering spurious components.

Patent Literature 2 discloses as follows. An apparatus including a microcomputer causes unnecessary signals such as components of higher harmonic waves of a clock signal which are generated due to a mechanism in which the apparatus operates in response to the clock signal supplied from the microcomputer. Such unnecessary signals interfere with a signal which the apparatus should proceed. In view of the circumstances, a frequency of the clock signal is temporally varied so that energy of the higher harmonic waves is dispersed, thereby reducing a noise level.

Citation List

Patent Literature 1

Japanese Patent Application Publication, Tokukai, No. 2006-174218 A (Publication Date: Jun. 29, 2006)

Patent Literature 2

Japanese Patent Application Publication, Tokukaihei, No. 11-143572 A (Publication Date: May 28, 1999)

SUMMARY OF INVENTION

Technical Problem

The OFDM receiver of Patent Literature 1 unfortunately requires additional circuits such as a circuit for detecting the interfering spurious components and a variable notch filter. Thus, the OFDM receiver has raised concern about an increase in power consumption and circuit size.

The system, disclosed in Patent Literature 2, for generating a clock signal cannot completely eliminate the noise whose frequencies fall within a target signal band. Thus, the system has not achieved a sufficient effect.

The present invention has been accomplished in view of the above problems. It is an object of the present invention to provide an electronic device which can prevent deterioration in reception performance, the deterioration being caused by in-band spurious components arising from higher harmonic waves whose frequencies are respective integral multiples of a clock frequency.

Solution to Problem

In order to solve the above problems, an electronic device of the present invention includes: a direct conversion receiver; and a clock synchronization circuit which operates in synchronization with a clock signal having a clock frequency $f_{clk}$, the direct conversion receiver including: a frequency converter circuit for carrying out a frequency conversion by mixing a received signal and a local oscillator signal so as to convert the received signal into a baseband signal; and a direct-current offset canceller circuit for removing a direct-current offset contained in a signal which has been subjected to the frequency conversion by the frequency converter circuit, said electronic device satisfying: $f_{LO}=N \times f_{clk}$ (1); and $(N-1) \times f_{clk} < fD1 < N \times f_{clk} < fD2 < (N_{+}1) \times f_{clk}$ (2), where $f_{LO}$ represents a frequency of the local oscillator signal, N represents an integer, fD1 represents a lower limit frequency of the received signal, and fD2 represents an upper limit frequency of the received signal.

The clock synchronization circuit used in the present invention operates in synchronization with the clock signal having the clock frequency $f_{clk}$. Thus, harmonic components, whose respective frequencies are respective integral multiples of the clock frequency $f_{clk}$, are mixed as spurious components into a path for the received signal.

The spurious component having the frequency of $N \times f_{clk}$ due to the frequency conversion by the frequency converter circuit is mixed with the local oscillator signal, and is thus converted into a DC component, which is then removed by the direct-current offset canceller circuit.

The higher harmonic wave spurious components having respective frequencies other than the frequency $N \times f_{clk}$ are converted into components having respective frequencies which are respective integral multiples of the clock frequency $f_{clk}$ because the local oscillator signal has the frequency of $N \times f_{clk}$. When the frequency $f_{LO}$ of the local oscillator signal is subtracted from the upper limit frequency fD2 of the received signal which has been subjected to the frequency conversion by the frequency converter circuit, the resultant difference becomes higher than 0 but lower than the clock frequency $f_{clk}$. Therefore, the higher harmonic wave spurious components, having respective frequencies other than the frequency $N \times f_{clk}$, do not fall within a frequency band of the target wave which has been subjected to the frequency conversion by the frequency converter circuit.

This allows provision of an electronic device which can prevent deterioration in reception performance, the deterioration being caused by in-band spurious components arising from higher harmonic waves whose frequencies are respective integral multiples of a clock frequency $f_{clk}$.

In order to solve the above problems, an electronic device of the present invention includes: a superheterodyne receiver including a frequency converter circuit for carrying out a frequency conversion by mixing a received signal and a local oscillator signal so as to convert the received signal into an intermediate frequency signal; and a clock synchronization circuit which operates in synchronization with a clock signal having a clock frequency $f_{clk}$, the electronic device satisfying: $f_{LO}=N \times f_{clk}$ (3); and $\{N+(K-1)\} \times f_{clk} < fD1 < fD2 < (N+K) \times f_{clk}$ (4), where $f_{LO}$ represents a frequency of the local oscillator signal, each of N and K represents an integer, fD1 represents a lower limit frequency of the received signal, and fD2 represents an upper limit frequency of the received signal.

The clock synchronization circuit used in the present invention operates in synchronization with the clock signal having the clock frequency $f_{clk}$. Thus, harmonic components, whose respective frequencies are respective integral multiples of the clock frequency $f_{clk}$, are mixed as spurious components into a path for the received signal.

Since the frequency of the local oscillator signal is equal to the frequency of $N \times f_{clk}$, when the frequency $f_{LO}$ of the local oscillator signal is subtracted from the lower limit frequency fD1 of the received signal which has been subjected to the frequency conversion by the frequency converter circuit, the resultant difference becomes higher than $(K-1) \times f_{clk}$. Similarly, when the frequency $f_{LO}$ of the local oscillator signal is subtracted from the upper limit frequency fD2 of the received signal, the resultant difference becomes lower than $K \times f_{clk}$. Therefore, the harmonic spurious components do not fall within the target wave spectrum observed after the frequency conversion by the frequency converter circuit.

This allows provision of an electronic device which can prevent deterioration in reception performance, the deterioration being caused by in-band spurious components arising from higher harmonic waves whose frequencies are respective integral multiples of a clock frequency $f_{clk}$.

Advantageous Effects of Invention

As described above, an electronic device of the present invention satisfies: $f_{LO}=N \times f_{clk}$ ... (1); and $(N-1) \times f_{clk} < fD1 < N \times f_{clk} < fD2 < (N+1) \times f_{clk}$ ... (2), where: $f_{LO}$ represents a frequency of the local oscillator signal; N represents an integer; fD1 represents a lower limit frequency of the received signal; and fD2 represents an upper limit frequency of the received signal.

Another electronic device of the present invention satisfies: $f_{LO}=N\times f_{clk}$ ... (3); and $\{N+(K-1)\}\times f_{clk}<fD1<fD2<(N+K)\times f_{clk}$ ... (4), where: $f_{LO}$ represents a frequency of the local oscillator signal; each of N and K represents an integer; fD1 represents a lower limit frequency of the received signal; and fD2 represents an upper limit frequency of the received signal.

This allows provision of an electronic device which can prevent deterioration in reception performance, the deterioration being caused by in-band spurious components arising from higher harmonic waves whose frequencies are respective integral multiples of a clock frequency.

DESCRIPTION OF EMBODIMENTS

Embodiment 1

An embodiment of the present invention will be described below with reference to FIGS. 1 through 3.

Figure 1:
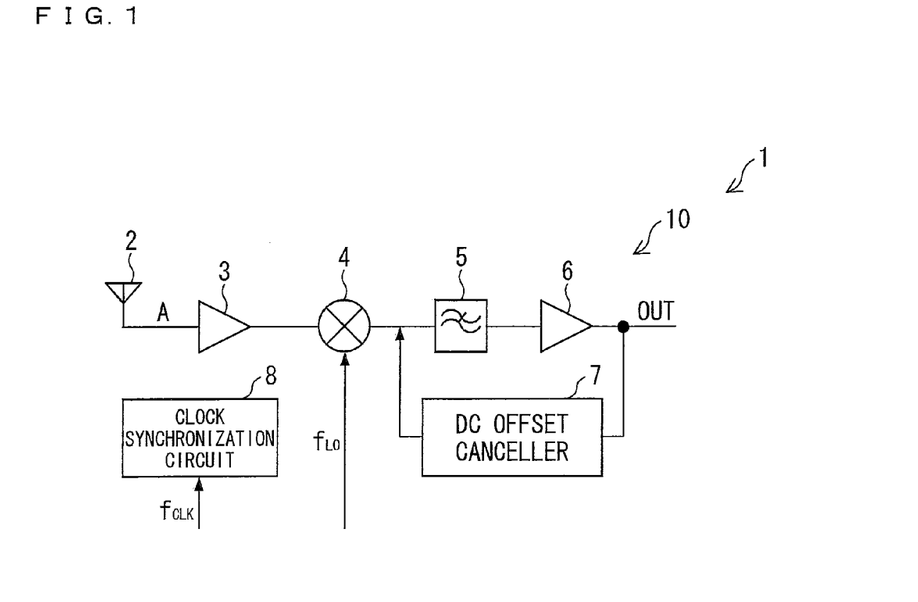
FIG. 1 is a block diagram illustrating an electronic device according to an embodiment of the present invention, which electronic device includes a direct conversion receiver and a clock synchronization circuit.

FIG. 1 is a block diagram illustrating an electronic device 1 of the present Embodiment 1. The electronic device 1 includes a direct conversion receiver 10 and a clock synchronization circuit 8. Specifically, the electronic device 1 includes an antenna 2, an amplifier 3, a mixer 4, a low-pass filter 5, an amplifier 6, a direct current (DC) offset canceller 7, and the clock synchronization circuit 8. The receiver 10 is constituted by the antenna 2, the amplifier 3, the mixer 4, the low-pass filter 5, the amplifier 6, and the DC offset canceller 7.

The electronic device 1 operates as follows. A RF signal received via the antenna 2 is amplified by the amplifier 3. Next, the mixer 4 carries out a frequency conversion by mixing the RF signal thus amplified and a local oscillator signal having a frequency $f_{LO}$ so that the RF signal thus amplified is converted into a baseband signal. After that, the low-pass filter 5 attenuates frequency components, other than a frequency component falling within a target signal band, of the baseband signal supplied from the mixer 4. The baseband signal thus attenuated is then amplified by the amplifier 6, and is outputted via an output terminal OUT.

The output signal of the amplifier 6 contains a DC offset. The DC offset is fed back by the DC offset canceller 7 to the output of the mixer, and is thus removed. The clock synchronization circuit 8 is used either to carry out part of a function of the direct conversion receiver 10 or to carry out another function different from the function of the direct conversion receiver 10. In either case, the operations are carried out in synchronization with a clock signal having a clock frequency $f_{clk}$. This causes the higher harmonic waves, whose respective frequencies are respective integral multiples of the clock frequency $f_{clk}$, to be undesirably mixed as spurious components into a path for the RF signal received via the antenna 2. The higher harmonic waves are mixed into the path via, e.g., power supply wiring, a common substrate, coupling of electric fields or magnetic fields, or an electromagnetic wave.

According to the direct conversion receiver 10, the mixer 4 mixes the RF signal received and the local oscillator signal having a frequency identical to a frequency of the RF signal received. This causes a phenomenon of self-mixing in which the local oscillator signal and a leak of the local oscillator signal are mixed, the leak being called a local leak.

The signal outputted from the mixer 4 contains a DC offset due to the self-mixing and/or a variation in device performance. This causes problems such as saturation of signals and deterioration in signal-to-noise (S/N) ratios in respective circuits by which the mixer 4 is followed.

For this reason, the direct conversion receiver 10 (wireless receiver) generally includes the DC offset canceller 7 (direct-current offset canceller circuit) for removing the DC offset contained in the signal which has been subjected to the frequency conversion by the mixer 4.

The DC offset canceller 7 functions as a filter for removing signals, having frequencies falling in a low frequency band, which include respective DC components. Thus, the DC offset canceller 7 removes not merely the DC offset caused by the self-mixing but signals, contained in the output signal of the mixer 4, each of which has a DC component or a frequency component close to the DC component.

Thus, in a case where an input signal to the mixer 4 contains a spurious component having a frequency identical to the frequency of the local oscillator signal, the spurious component is mixed with the local oscillator signal so as to be converted into a DC offset (DC component). The DC offset is removed by the DC offset canceller 7.

In view of this, the circuit (the clock synchronization circuit 8 of FIG. 1) which operates in synchronization with the clock signal having a frequency of $f_{clk}$ has an operating clock frequency ($f_{CLK}$) which is set so that a higher harmonic wave of the operating clock frequency has a frequency coinciding with the frequency ($f_{LO}$) of the local oscillator signal. This allows the DC offset canceller 7 to remove signals (spurious components caused by the clock signal) which are mixed into from the clock synchronization circuit 8, which is included in the direct conversion receiver 10 as an essential component.

Figure 2:
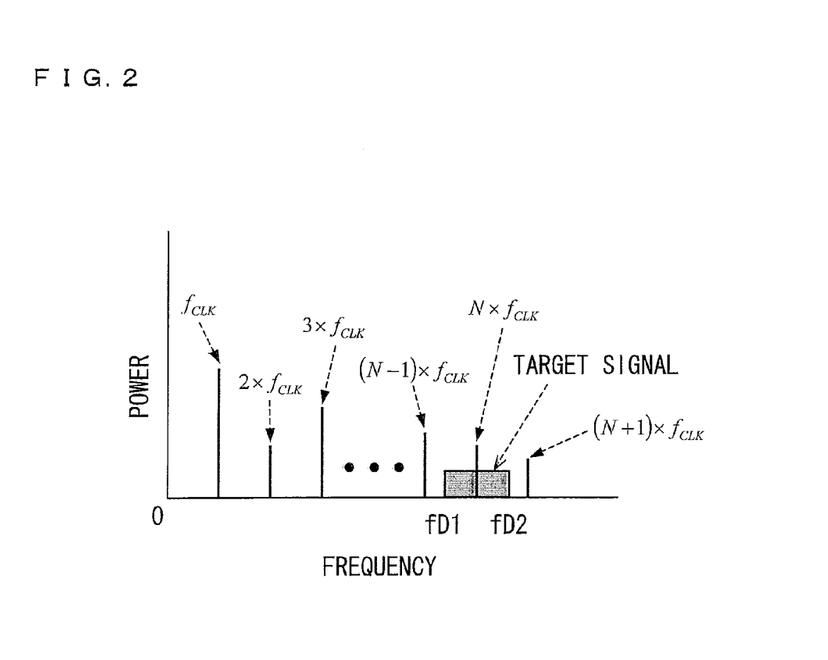
FIG. 2 illustrates a signal spectrum showing a frequency relationship between harmonic spurious components and a target signal, which relationship is observed when a frequency of an N-th order higher harmonic wave of a clock signal having a clock frequency of $f_{clk}$ coincides at $N\times f_{clk}$ with a frequency of a local oscillator signal.
Figure 3:
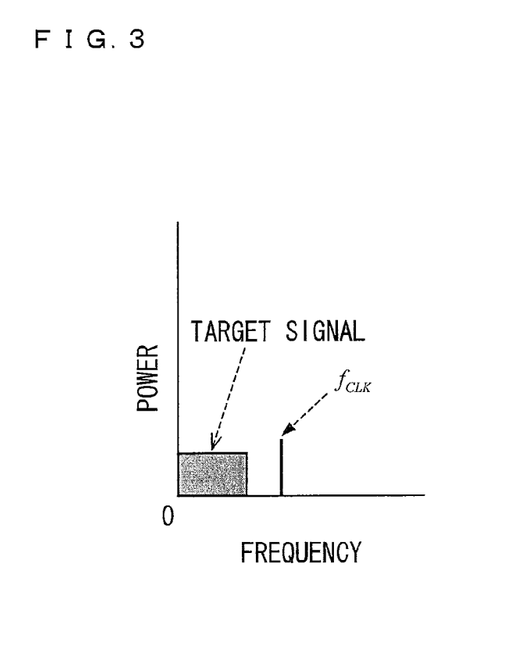
FIG. 3 illustrates a signal spectrum observed after a RF signal shown in the signal spectrum of FIG. 2 is subjected to frequency conversion by a mixer included in the direct conversion receiver.

FIG. 2 is a signal spectrum showing a frequency relationship between a higher harmonic wave spurious component and a target signal, the relationship being observed in a case where an N-th order higher harmonic wave of the clock signal having a clock frequency of $f_{clk}$ and the local oscillator signal have a frequency of $N \times f_{clk}$. FIG. 3 is a signal spectrum observed after a RF signal shown in the signal spectrum of FIG. 2 is subjected to frequency conversion by the mixer 4 of the direct conversion receiver 10.

Since the frequency of the local oscillator signal is equal to the frequency of $N \times f_{clk}$, the spurious component having the frequency of $N \times f_{clk}$ is converted into a DC component by the mixer 4 of FIG. 1, and is then removed by the DC offset canceller 7.

Further, the spurious components having respective frequencies of $(N-1) \times f_{clk}$ and $(N+1) \times f_{clk}$ are converted by the mixer 4 into a spurious component having the clock frequency $f_{clk}$.

In view of this, the clock frequency $f_{clk}$ is selected so that the spurious components having the respective frequencies $(N-1) \times f_{clk}$ and $(N+1) \times f_{clk}$ fall outside the target signal band (see FIG. 2). This allows the baseband signal, which has been subjected to the frequency conversion by the mixer 4, to have no spurious component in the target signal band.

According to the present Embodiment 1, the clock frequency $f_{clk}$ is selected so that frequency relationships indicated by the following Formulae (1) and (2) are satisfied (see FIG. 2):

$$f_{LO} = N \times f_{clk} \quad (1)$$

$$(N-1) \times f_{clk} < fD1 < N \times f_{clk} < fD2 < (N+1) \times f_{clk} \quad (2)$$

where N represents an integer, fD1 represents a lower limit frequency of the target signal (received signal), and fD2 represents an upper limit frequency of the target signal.

The spurious component having the frequency of $N \times f_{clk}$ is mixed with the local oscillator signal as a result of the frequency conversion by the mixer 4 so as to be converted into a DC component. The DC component is then removed by the DC offset canceller 7.

The higher harmonic wave spurious components having respective frequencies other than the frequency $N \times f_{clk}$ are converted into components having respective frequencies which are respective integral multiples of the clock frequency $f_{clk}$ because the local oscillator signal has the frequency of $N \times f_{clk}$. When the frequency $f_{LO}$ of the local oscillator signal is subtracted from the upper limit frequency fD2 of the received signal which has been subjected to the frequency conversion by the mixer 4, the resultant difference becomes higher than 0 but lower than the clock frequency $f_{clk}$. Therefore, the higher harmonic wave spurious components, having respective frequencies other than the frequency $N \times f_{clk}$, do not fall within a frequency band of the target wave which has been subjected to the frequency conversion by the mixer 4.

Examples of the circuit which operates in synchronization with a clock signal include a digital circuit and a switched capacitor circuit. The circuit is used either to carry out part of a function of the receiver 10 or to carry out another function different from the function of the receiver 10.

An example of the digital circuit used to carry out part of the function of the receiver 10 is a demodulation circuit for demodulating a digitally modulated signal. An example of the digital circuit used to carry out another function different from the function of the receiver 10 is a CPU in an arrangement where the receiver 10 is mounted in a personal computer.

An example of the switched capacitor circuit used to carry out part of the function of the receiver 10 is a switched capacitor circuit by which the low-pass filter 5 of FIG. 1 is realized. An example of the switched capacitor circuit used to carry out another function different from the function of the receiver 10 is a switched capacitor circuit by which an analog-to-digital (AD) converter is realized for converting an output signal of an image sensor mounted in a portable phone including the receiver 10.

In any of the above examples, the clock frequency $f_{clk}$ is selected so that Formulae (1) and (2) concerning the relationship between (i) the clock frequency $f_{clk}$ and (ii) the frequency $f_{LO}$ of the local oscillator signal supplied to the receiver 10 are satisfied. This prevents in-band spurious components from being generated in the receiver 10 from the harmonic spurious components of the clock signal having the clock frequency $f_{clk}$, which clock signal is supplied to the digital circuit, i.e., the clock synchronization circuit 8. This in turn allows provision of an electronic device which can prevent deterioration in reception performance, the deterioration being caused by in-band spurious components arising from higher harmonic waves whose frequencies are respective integral multiples of a clock frequency $f_{clk}$.

The clock synchronization circuit 8 of the present Embodiment 1 can have a clock frequency $f_{clk}$ (operating clock frequency) which is identical to the frequency $f_{LO}$ of the local oscillator signal. This corresponds to a case where N=1 in Formula (1). In this case, the frequency $f_{LO}$ of the local oscillator signal can be used as the clock frequency $f_{clk}$ of the clock synchronization circuit 8, thereby allowing a reduction in circuit size.

Embodiment 2

Another embodiment of the present invention will be described below with reference to FIGS. 4 through 6.

Figure 4:
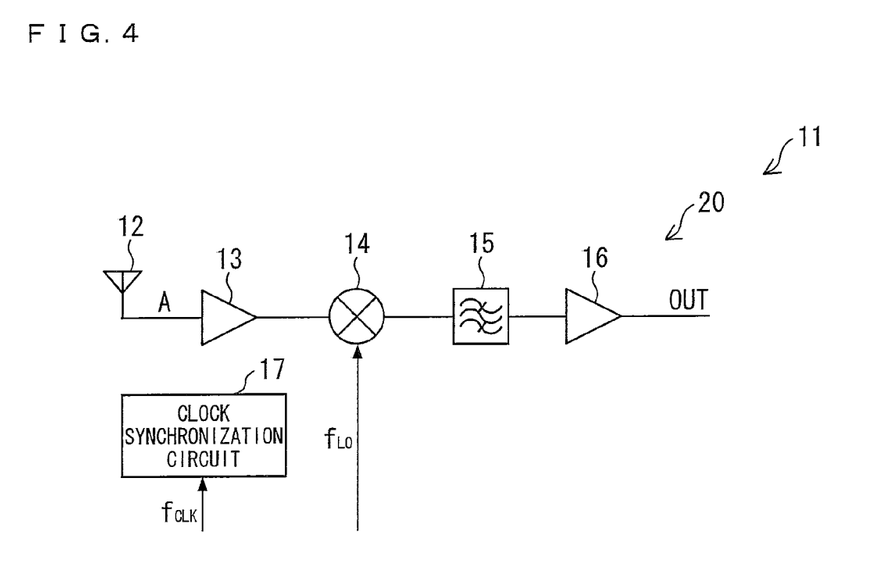
FIG. 4 is a block diagram illustrating an electronic device according to another embodiment of the present invention, which electronic device includes a heterodyne receiver and a clock synchronization circuit.

FIG. 4 is a block diagram illustrating an electronic device 11 of the present Embodiment 2. The electronic device 11 includes a superheterodyne receiver 20 and a clock synchronization circuit 17. Specifically, the electronic device 11 includes an antenna 12, an amplifier 13, a mixer 14, a band-pass filter 15, an amplifier 16, and the clock synchronization circuit 17. The superheterodyne receiver 20 is constituted by the antenna 12, the amplifier 13, the mixer 14, the band-pass filter 15, and the amplifier 16.

The electronic device 11 operates as follows. A RF signal received via the antenna 12 is amplified by the amplifier 13. Next, the mixer 14 carried out a frequency conversion by mixing the RF signal thus amplified and a local oscillator signal having a frequency $f_{LO}$ so that the RF signal thus amplified is converted into an intermediate frequency signal. After that, the band-pass filter 15 attenuates frequency components, other than a frequency component falling within a target signal band, of the intermediate frequency signal supplied from the mixer 14. The intermediate frequency signal thus attenuated is then amplified by the amplifier 16, and is outputted via an output terminal OUT.

The clock synchronization circuit 17 is used either to carry out part of a function of the superheterodyne receiver 20 or to carry out another function different from the function of the superheterodyne receiver 20. In either case, the operations are carried out in synchronization with a clock signal having a clock frequency $f_{clk}$. This causes the higher harmonic waves, whose respective frequencies are respective integral multiples of the clock frequency $f_{clk}$, to be undesirably mixed as spurious components into a path for the RF signal received via the antenna 12. The higher harmonic waves are mixed into the path via, e.g., power supply wiring, a common substrate, coupling of electric fields or magnetic fields, or an electromagnetic wave.

Figure 5:
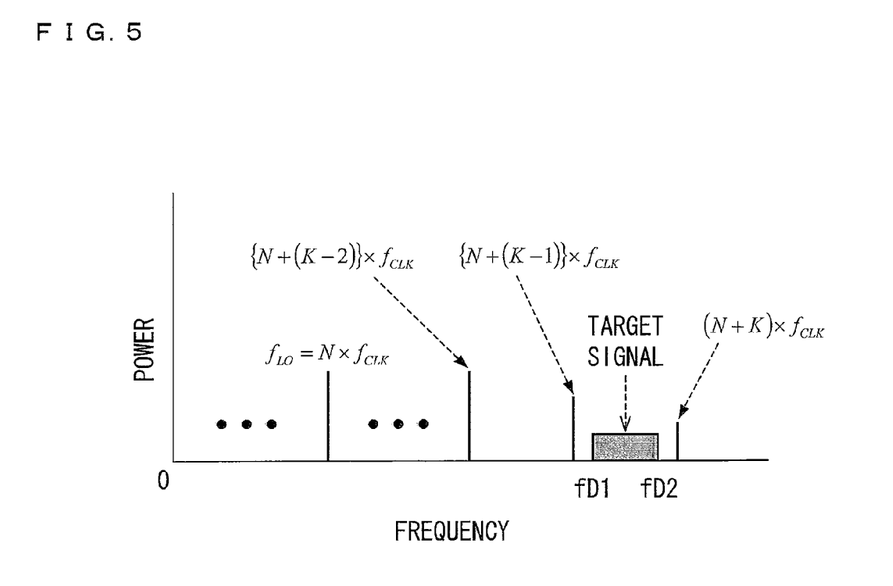
FIG. 5 illustrates a frequency spectrum observed in a superheterodyne receiver, which spectrum shows a frequency relationship between a frequency of a local oscillator signal and an operating clock frequency of a circuit which operates in synchronization with a clock signal, with respect to an integer K.
Figure 6:
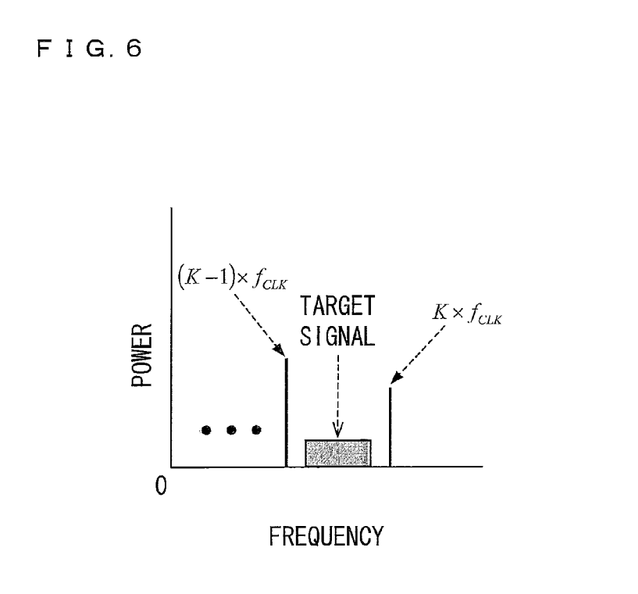
FIG. 6 illustrates a signal spectrum observed after a RF signal shown in the signal spectrum of FIG. 5 is subjected to frequency conversion by a mixer included in the superheterodyne receiver.

As shown in FIG. 5, the superheterodyne receiver satisfies a frequency relationship of $f_{LO}=N \times f_{clk}$, where N represents an integer, between (i) the frequency $f_{LO}$ of the local oscillator signal and (ii) the clock frequency $f_{clk}$ of the circuit which operates in synchronization with the clock signal. In addition, the clock frequency $f_{clk}$ is selected so that the frequency band of a target signal falls between respective frequencies of the higher harmonic waves of the clock signal having the clock frequency $f_{clk}$, i.e., between $\{N+(K-1)\} \times f_{clk}$ and $(N+K) \times f_{clk}$, where K represents an integer. As illustrated in FIG. 6, the mixer 14 then converts the respective frequencies of the higher harmonic waves of the clock signal having the clock frequency $f_{clk}$ so that the frequencies fall outside the target signal band.

The spurious components supplied to the mixer 14 of the superheterodyne receiver 20 have respective frequencies of ... $N \times fclk$, $(N+1) \times fclk$, $(N+2) \times fclk$, ..., $\{N+(K-2)\} \times fclk$, $\{N \pm (K-1)\} \times fclk$, $(N+K) \times fclk$, $\{N+(K+1)\} \times fclk$, ....

According to the present Embodiment 2, the clock frequency $f_{clk}$ is selected so that frequency relationships indicated by the following Formulae (3) and (4) are satisfied (see FIG. 5):

$$f_{LO}=N \times f_{clk} \quad (3)$$

$$\{N+(K-1)\} \times f_{clk} < fD1 < fD2 < (N+K) \times f_{clk} \quad (4)$$

where N represents an integer, K represents another integer which is different from the integer N, fD1 represents a lower limit frequency of the target signal (received signal), and fD2 represents an upper limit frequency of the target signal.

Since the frequency of the local oscillator signal is equal to the frequency of $N \times f_{clk}$, when the frequency $f_{LO}$ of the local oscillator signal is subtracted from the lower limit frequency fD1 of the received signal which has been subjected to the frequency conversion by the mixer 14, the resultant difference becomes higher than $(K-1) \times f_{clk}$. Similarly, when the frequency $f_{LO}$ of the local oscillator signal is subtracted from the upper limit frequency fD2 of the received signal, the resultant difference becomes lower than $K \times f_{clk}$.

As described above, the mixer 14 carries out a frequency conversion so as to convert the frequencies of the respective higher harmonic wave spurious components, which frequencies are respective integral multiples of the clock frequency $f_{clk}$, into frequencies of respective higher harmonic waves of the clock signal having the clock frequency $f_{clk}$. The frequencies thus converted do not fall within a frequency band of the target wave which has been subjected to the frequency conversion by the mixer 14. FIG. 6 is a signal spectrum of the RF signal, shown in the signal spectrum of FIG. 5, which has been subjected to the frequency conversion by the mixer of the superheterodyne receiver.

Examples of the circuit which operates in synchronization with a clock signal include a digital circuit and a switched capacitor circuit. The circuit is used either to carry out part of a function of the receiver 20 or to carry out another function different from the function of the receiver 20.

An example of the digital circuit used to carry out part of the function of the receiver 20 is a demodulation circuit for demodulating a digitally modulated signal. An example of the digital circuit used to carry out another function different from the function of the receiver 20 is a CPU in an arrangement where the receiver 20 is mounted in a personal computer.

An example of the switched capacitor circuit used to carry out part of the function of the receiver 20 is a switched capacitor circuit by which the band-pass filter of FIG. 4 is realized. An example of the switched capacitor circuit used to carry out another function different from the function of the receiver 20 is a switched capacitor circuit by which an AD converter is realized for converting an output signal of an image sensor mounted in a portable phone including the receiver 20.

In any of the above examples, the clock frequency $f_{clk}$ is selected so that Formulae (3) and (4) concerning the relationship between (i) the clock frequency $f_{clk}$ and (ii) the frequency $f_{LO}$ of the local oscillator signal supplied to the receiver 20 are satisfied. This prevents in-band spurious components from being generated in the receiver 20 from the harmonic spurious components of the clock signal having the clock frequency $f_{clk}$, which clock signal is supplied to the digital circuit, i.e., the clock synchronization circuit. This in turn allows provision of an electronic device which can prevent deterioration in reception performance, the deterioration being caused by in-band spurious components arising from higher harmonic waves whose frequencies are respective integral multiples of a clock frequency $f_{clk}$.

The clock synchronization circuit 17 of the present Embodiment 2 can have a clock frequency $f_{clk}$ (operating clock frequency) which is identical to the frequency $f_{LO}$ of the local oscillator signal. This corresponds to a case where N=1 in Formula (3). In this case, the frequency $f_{LO}$ of the local oscillator signal can be used as the clock frequency $f_{clk}$ of the clock synchronization circuit 17, thereby allowing a reduction in circuit size.

Embodiment 3

A further embodiment of the present invention will be described below with reference to FIG. 7.

In Embodiments 1 and 2, as represented by Formulae (1) and (3), respectively, the clock frequency $f_{clk}$ is selected so that $f_{LO}=N \times f_{clk}$ is satisfied between (i) a frequency $f_{LO}$ of a local oscillator signal and (ii) a clock frequency $f_{clk}$.

The clock signal having the clock frequency $f_{clk}$, which satisfies $f_{LO}=N \times f_{clk}$, can preferably be generated, with use of a frequency divider 22, by dividing by N the local oscillator signal, having the frequency $f_{LO}$, which is generated by an oscillator 21.

Figure 7:
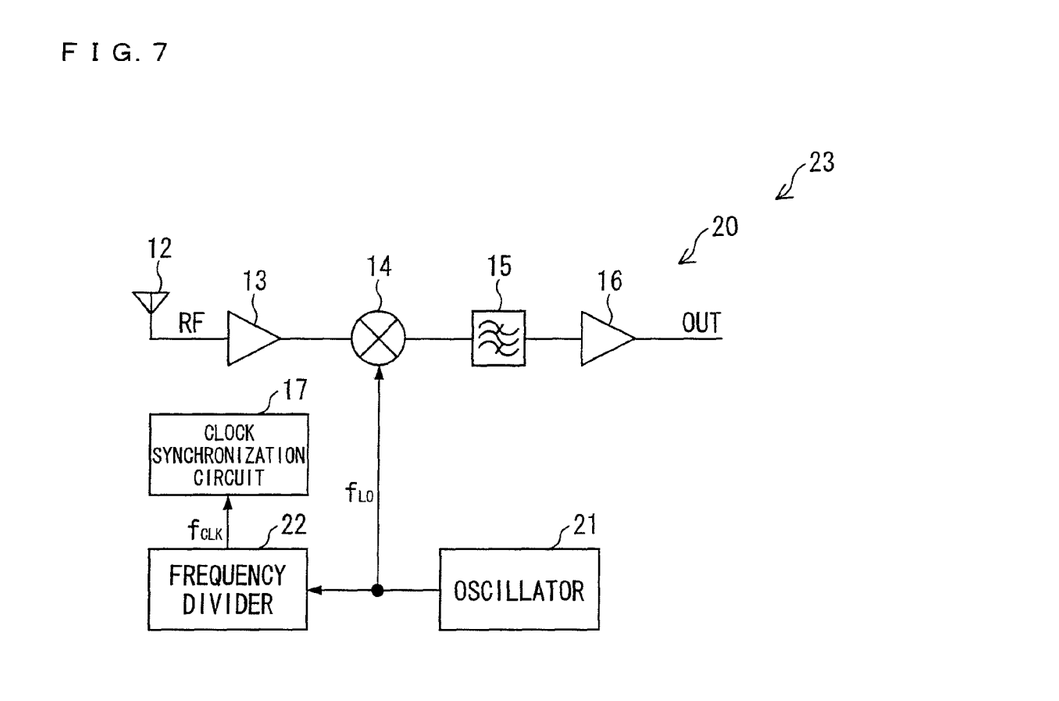
FIG. 7 is a block diagram illustrating an electronic device 23 formed by the electronic device of FIG. 4 provided with an oscillator and a frequency divider.

FIG. 7 is a block diagram illustrating an electronic device 23, which is realized by adding the oscillator 21 and the frequency divider 22 to the electronic device 11 of FIG. 4. This arrangement allows a reduction in circuit size and power consumption, in comparison with an arrangement in which a clock signal is generated by use of an oscillator separate from an oscillator for generating the local oscillator signal.

Embodiment 4

In a case where the receiver 10 of Embodiment 1 or the superheterodyne receiver 20 of Embodiment 2 has a function of selecting and receiving a target signal from among a plurality of received signals, like a receiver such as a television receiver or a radio receiver, it is preferable that the clock frequency $f_{clk}$ should be varied according to a frequency band of the received signal thus selected.

The electronic device 1 of Embodiment 1 can be arranged such that the clock frequency $f_{clk}$ is selected so that Formulae (1) and (2) are satisfied while the frequency $f_{LO}$ of the local oscillator signal is being varied.

The selection of the clock frequency $f_{clk}$ as above allows Formula (2) to be satisfied. Further, since $f_{clk}=f_{LO}/N$ falls between $(N-1)/(N\times f_{LO})$ and $(N+1)/(N\times f_{LO})$, Formula (1) can also be satisfied.

Even in a case where the selected clock frequency $f_{clk}$ is too high as an operating frequency of the clock synchronization circuit, it is possible to satisfy Formulae (1) and (2) by increasing the integer N so that the clock frequency $f_{clk}$ is lowered.

The clock frequency $f_{clk}$ is also varied in response to a change in the frequency $f_{LO}$ of the local oscillator signal. Thus, in a case where the electronic device includes a circuit susceptible to a spurious component having a specific frequency, it is possible to avoid a situation in which the specific frequency becomes identical with any of frequencies of the respective higher harmonic waves, which frequencies are integral multiples of the frequency $f_{clk}$.

Assume here that $f_{LO}=500$ MHz, $N=25$, and $f_{clk}=20$ MHz. In this case, a third order higher harmonic wave of the clock signal having the frequency $f_{clk}$ has a frequency of 60 MHz. In a case where the electronic device includes a circuit susceptible to a spurious component having a frequency of 60 MHz, $f_{LO}$, N, and $f_{clk}$ are changed to 505 MHz, 25, and 20.2 MHz, respectively. This causes the third order higher harmonic wave of the clock signal having the frequency $f_{clk}$ to have a frequency of 60.6 MHz, thereby allowing a reduction in effect of the spurious component having a frequency of 60 MHz.

The electronic device 11 of Embodiment 2 can similarly be arranged such that the clock frequency $f_{clk}$ is selected so that Formulae (3) and (4) are satisfied, while the frequency $f_{LO}$ of the local oscillator signal is being varied.

The selection of the clock frequency $f_{clk}$ as above allows Formula (4) to be satisfied. Further, since $f_{clk}=f_{LO}/N$ falls between $\{N+(K-1)\}/(N\times f_{LO})$ and $(N+K)/(N\times f_{LO})$, Formula (3) can also be satisfied.

Even in a case where the selected clock frequency $f_{clk}$ is too high as an operating frequency of the clock synchronization circuit, it is possible to satisfy Formulae (3) and (4) by increasing the integer N so that the clock frequency $f_{clk}$ is lowered.

The clock frequency $f_{clk}$ is also varied in response to a change in the frequency $f_{LO}$ of the local oscillator signal. Thus, in a case where the electronic device includes a circuit susceptible to a spurious component having a specific frequency, it is possible to avoid a situation in which the specific frequency becomes identical with any of frequencies of the respective higher harmonic waves, which frequencies are integral multiples of the frequency $f_{clk}$.

In a case where a direct conversion receiver is adopted as in Embodiment 1, the clock frequency $f_{clk}$ is selected so that Formulae (1) and (2) are satisfied. It is assumed that (i) a received signal having a frequency band in a range from 100 MHz to 110 MHz is selected and (ii) the local oscillator signal has a frequency of 105 MHz. On that condition, when (i) 21 MHz is selected as a clock frequency $f_{clk}$ and (ii) N is equal to 5, Formulae (1) and (2) are satisfied.

It is assumed that (i) a received signal having a frequency band in a range from 110 MHz to 120 MHz is selected and (ii) the local oscillator signal has a frequency of 115 MHz. On that condition, when (i) 23 MHz is selected as a clock frequency $f_{clk}$ and (ii) N is equal to 5, Formulae (1) and (2) are satisfied.

Further, It is assumed that (i) a received signal having a frequency band in a range from 120 MHz to 130 MHz is selected and (ii) the local oscillator signal has a frequency of 125 MHz. On that condition, when (i) 25 MHz is selected as a clock frequency $f_{clk}$ and (ii) N is equal to 5, Formulae (1) and (2) are satisfied.

In a case where the clock frequency $f_{clk}$ of 25 MHz is too high as an operating frequency of the clock synchronization circuit 8, the integer N is changed into 6 from 5 and the clock frequency $f_{clk}$ is changed into 125/6=20.833 MHz, in Formula (1). This allows Formulae (1) and (2) to be satisfied.

In a case where a clock frequency $f_{clk}$ is thus appropriately selected in accordance with the frequency band of a received signal which is selected, Formulae (1) and (2) are satisfied. Furthermore, in a case where an integer N is appropriately selected, it is possible to change the clock frequency $f_{clk}$ into a frequency suitable as an operating frequency of the clock synchronization circuit 8. This prevents in-band spurious components from being generated in the receiver 10 from the harmonic spurious components of the clock signal having the clock frequency $f_{clk}$, which clock signal is supplied to the digital circuit, i.e., the clock synchronization circuit 8.

The above description deals with the case in which the receiver is a direct conversion receiver as in Embodiment 1. However, in the case in which the receiver is a superheterodyne receiver as in Embodiment 2, it is also possible to appropriately select a clock frequency $f_{clk}$ in accordance with the frequency band of a received signal which is selected.

In the electronic device of each of the embodiments, the clock synchronization circuit can be a digital circuit.

In the electronic device of each of the embodiments, the clock synchronization circuit can be a switched capacitor circuit.

In the electronic device of each of the embodiments, the clock synchronization circuit can include both a digital circuit and a switched capacitor circuit.

In the electronic device of each of the embodiments, the frequency converter circuit and the clock synchronization circuit can be fabricated so as to constitute a single integrated circuit.

In the electronic device of each of the embodiments, the frequency converter circuit and the clock synchronization circuit can be fabricated in a single package.

In the electronic device of each of the embodiments, the frequency converter circuit and the clock synchronization circuit can be mounted on a single printed circuit board.

In the electronic device of each of the embodiments, the received signal can be a digitally modulated signal and the circuit which operates in synchronization with the clock signal can be a demodulation circuit for demodulating the digitally modulated signal.

In the electronic device of each of Embodiments 1, 3, and 4, each of the frequency converter circuit and the digital circuit which operates in synchronization with the clock signal having the frequency of $f_{clk}$ can be used so as to carry out another function different from a function of the direct conversion receiver.

In the electronic device of each of Embodiments 2 through 4, each of the frequency converter circuit and a digital circuit which operates in synchronization with the clock signal having the clock frequency $f_{clk}$ can carry out another function different from a function of the superheterodyne receiver.

In the electronic device of each of the above embodiments, the frequency converter circuit and a digital circuit which operates in synchronization with the clock signal having the clock frequency $f_{clk}$ can be used to carry out a single function in combination. This implies, for example, that the frequency converter circuit and the digital circuit carry out a function of frequency conversion for removing an image. Since the digital circuit corrects a variation in mixer, a circuit which improves an image rejection ratio.

In the electronic device of each of the embodiments, the frequency converter circuit can be used to carry out a receiving function.

The present invention is not limited to the description of the embodiments above, but may be altered by a skilled person in the art within the scope of the claims. An embodiment appropriately derived from any combination of technical means disclosed in respective different embodiments is also encompassed in the technical scope of the present invention.

Industrial Applicability

The present invention can be suitably applied to an electronic device which includes a receiving circuit for telecommunications because the electronic device of the present invention can prevent deterioration in reception performance, the deterioration being caused by in-band spurious components arising from higher harmonic waves whose frequencies are respective integral multiples of a clock frequency.

REFERENCE SIGNS LIST 1, 11, 23 electronic device
2, 12 antenna
3, 13 amplifier
4, 14 mixer (frequency converter circuit)
5 low-pass filter
6, 16 amplifier
7 DC offset canceller (direct-current offset canceller circuit)
8, 17 clock synchronization circuit
10 receiver
15 band-pass filter
20 superheterodyne receiver
21 oscillator
22 frequency divider
23 electronic device
A RF signal input point
K, N integer
OUT output terminal
$f_{LO}$ frequency of local oscillator signal
$f_{clk}$ clock frequency

The invention claimed is:

1. An electronic device comprising:
   a direct conversion receiver; and
   a clock synchronization circuit which operates in synchronization with a clock signal having a clock frequency $f_{clk}$,
   the direct conversion receiver including:
   a frequency converter circuit for carrying out a frequency conversion by mixing a received signal and a local oscillator signal so as to convert the received signal into a baseband signal; and
   a direct-current offset canceller circuit for removing a direct-current offset contained in a signal which has been subjected to the frequency conversion by the frequency converter circuit,
   said electronic device selecting, according to a lower limit frequency fD1 and an upper limit frequency fD2 of the received signal, a value for an integer N or a value for the clock frequency $f_{clk}$ so as to satisfy:

$$f_{LO} = N \times f_{clk} \quad (1); \text{ and}$$

$$(N-1) \times f_{clk} < fD1 < N \times f_{clk} < fD2 < (N+1) \times f_{clk} \quad (2),$$

where $f_{LO}$ represents a frequency of the local oscillator signal.

2. The electronic device according to claim 1, wherein the N is equal to 1.

3. The electronic device according to claim 1, wherein the clock synchronization circuit is a digital circuit.

4. The electronic device according to claim 1, wherein the clock synchronization circuit is a switched capacitor circuit.

5. The electronic device according to claim 1, the clock synchronization circuit includes a digital circuit and a switched capacitor circuit.

6. The electronic device according to claim 1, wherein:
   the frequency $f_{LO}$ of the local oscillator signal is changed; and
   the clock frequency $f_{clk}$ is selected so that the Formulae (1) and (2) are satisfied.

7. The electronic device according to claim 1, further comprising:
   an oscillator for outputting the local oscillator signal having the frequency $f_{LO}$; and
   a frequency divider for dividing by N the local oscillator signal so as to output the clock signal having the clock frequency $f_{clk}$.

8. The electronic device according to claim 1, wherein the frequency converter circuit and the clock synchronization circuit are fabricated so as to constitute a single integrated circuit.

9. The electronic device according to claim 1, wherein the frequency converter circuit and the clock synchronization circuit are fabricated in a single package.

10. The electronic device according to claim 1, wherein the frequency converter circuit and the clock synchronization circuit are mounted on a single printed circuit board.

11. The electronic device according to claim 1, wherein:
    the received signal is a digitally modulated signal; and
    a circuit which operates in synchronization with the clock signal is a demodulation circuit for demodulating the digitally modulated signal.

12. The electronic device according to claim 1, wherein each of the frequency converter circuit and a digital circuit which operates in synchronization with the clock signal having the clock frequency $f_{clk}$ is used to carry out another function different from a function of the direct conversion receiver.

13. The electronic device according to claim 1, wherein the frequency converter circuit and a digital circuit which operates in synchronization with the clock signal having the clock frequency $f_{clk}$ are used to carry out a single function in combination.

14. The electronic device according to claim 1, wherein the frequency converter circuit is used to carry out a receiving function.

* * * * *